United States Patent
Chi et al.

(10) Patent No.: US 6,914,424 B2
(45) Date of Patent: *Jul. 5, 2005

(54) AUTOMATIC INTEGRATED CIRCUIT TESTING SYSTEM AND DEVICE USING AN INTEGRATIVE COMPUTER AND METHOD FOR THE SAME

(75) Inventors: Ming-Ren Chi, Taipei Hsien (TW); Peng-Chia Kuo, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 153 days.

This patent is subject to a terminal disclaimer.

(21) Appl. No.: 10/248,537

(22) Filed: Jan. 28, 2003

(65) Prior Publication Data

US 2003/0141860 A1 Jul. 31, 2003

(30) Foreign Application Priority Data

Jan. 29, 2002 (TW) ........................................ 91101432 A

(51) Int. Cl.⁷ .............................................. G01R 31/26
(52) U.S. Cl. ..................... 324/158.1; 324/73.1; 702/121
(58) Field of Search ............................... 324/73.1, 765, 324/158.1; 209/571, 573–574; 414/416.01; 702/117, 121

(56) References Cited

U.S. PATENT DOCUMENTS

| | | | | |
|---|---|---|---|---|
| 5,036,479 A | * | 7/1991 | Prednis et al. | ............ 702/121 |
| 5,313,156 A | * | 5/1994 | Klug et al. | ............ 324/158.1 |
| 5,865,319 A | * | 2/1999 | Okuda et al. | ............ 209/574 |
| 6,442,712 B1 | | 8/2002 | Jeon | |

FOREIGN PATENT DOCUMENTS

| | | |
|---|---|---|
| CN | 1376932 A | 3/2002 |
| GB | 2382663 A | 9/2001 |
| JP | 11-327943 B1 | 5/1998 |
| JP | 2000-46907 | 7/1998 |
| KR | 98093478 | 5/1997 |

* cited by examiner

Primary Examiner—Minh N. Tang
(74) Attorney, Agent, or Firm—Jiang Chyun IP office

(57) ABSTRACT

An automatic integrated circuit testing system, device and method using an integrative computer. The system includes a machine frame having at least one testing computer for holding and testing the integrated circuit. The machine frame also has at least one automatic plugging/unplugging machine for engaging the integrated circuits with the computer system and removing the integrated circuits after testing has been completed. The machine frame further includes at least one controller device electrically connected to the testing computer and the automatic plugging/unplugging machine for controlling the movements of the automatic plugging/unplugging machine and the testing computer. The testing computer and the integrated circuit together form an integrative computer system capable of executing various general application programs and special testing programs for integrative testing and analysis.

30 Claims, 5 Drawing Sheets

AUTOMATIC INTEGRATED CIRCUIT TESTING SYSTEM AND DEVICE USING AN INTEGRATIVE COMPUTER AND METHOD FOR THE SAME

CROSS REFERENCE TO RELATED APPLICATIONS

This application claims the priority benefit of Taiwan application Ser. No. 91101432, filed on Jan. 29, 2002.

BACKGROUND OF INVENTION

1. Field of the Invention

The present invention relates to an automatic integrated circuit testing system, device and method. More particularly, the present invention relates to an automatic integrated circuit testing system, device and method capable of simulating the final states of a terminal user and conducting a dynamic test.

2. Description of the Related Art

Most people directly or indirectly use a server, workstation, desktop computer, notebook computer, portable computer, personal digital assistant, palm-top computer, pocket personal computer or industrial computer. All these computers are built using integrated circuits (ICs). Before putting all these integrated circuits to work sophisticated testing must be conducted to ensure that all of them are in good working order.

FIG. 1 is a block diagram showing the layout of a conventional personal computer. As shown in FIG. 1, major integrated circuits within a conventional personal computer (100) include a central processing unit (CPU) (110), a system bus controller (112) and an input/output bus controller (114). A memory unit (116) and an advanced graphic port (118) are electrically connected to the system bus controller (112) while a monitor (120) for outputting images is electrically connected to the advanced graphic port (118). A peripheral component interface (PCI) is connected to both the system bus controller (112) and the input/output bus controller (114). An integrated drive electronic (IDE) interface (130), a floppy disk (132), a parallel port (134), a serial port (136) and a universal serial bus (USB) (138) are electrically connected to the input/output bus controller (114). In addition, an audio unit (140) and an Ethernet unit (142) may also be electrically attached to the input/output bus controller (114).

The aforementioned devices including the central processing unit (110), the system bus controller (112), the input/output bus controller (114), the memory unit (116), the graphics accelerator within the advanced graphic port (118), the integrated circuit within the expansion interface of the peripheral component interface (122), the audio chip and the Ethernet chip are all constructed from a variety of integrated circuits (ICs). Since all these integrated circuits are important components for the proper functioning of the computer, the performance of the integrated circuits and their compatibility with each other determines the ultimate performance of a computer.

FIG. 2 is a block diagram showing the steps in a conventional method of testing an integrated circuit. A conventional integrated circuit (202), such as logic IC, undergoes a preliminary testing immediately after wafer fabrication. The wafer is cut into chips and packaged. Thereafter, a final test (204) is conducted before shipment (206). In general, the integrated circuit (202) is placed inside automatic test equipment (ATE). The automatic test equipment connects electrically with various contact points on the integrated circuit (202) through a test socket. A pre-determined functional simulation is carried out to test the integrated circuit (202). Operation of the integrated circuit under the simulation is then judged to be normal or not. A conventional integrated circuit test always uses specified programs to carry out the functional simulation and the final state of the device at the end of the test is used to judge for normality. According to the test results, integrated circuits are sorted into separate bins before delivery. For memory ICs, a burn-in test (210) is conducted after the first stage final test (208). The memory IC needs to undergo a second stage final test (212) before shipment to screen out early failure parts. Both the first stage final test (208) and the second stage final test (212) are carried out using automatic test equipment. On the other hand, the burn-in test (210) is carried out manually or semi-automatically. The integrated circuit is plugged into the socket of a testing board and then placed inside a heating station. The integrated circuit is thermally stressed, voltage stressed or current stressed. Nevertheless, this type of integrated circuit testing only tests the functions of an integrated circuit by program simulation and has no special procedures for simulating the actual operating states of a terminal user. Consequently, there is no guarantee for product stability or circuit compatibility after all the integrated circuits are assembled to form a computer system.

FIG. 3 is a block diagram showing the steps carried out in a conventional integrated circuit module test. To resolve the issue of a conventional integrated circuit test not having any terminal user simulation, an IC module test may be inserted between the final test and delivery. To conduct a conventional IC module test, a module such as an interface or a complete computer system is provided. The integrated circuit (302) is manually plugged into a module or a complete computer system capable of simulating a terminal user's operating environment (in step 304). A testing operation (306) is then carried out. Only the integrated circuits passing the test are delivered (308). Since the test is carried out manually and the assessment of test results is also determined by human observation, productivity is lowered while testing time is increased leading to lower yields and higher production costs. Moreover, test accuracy is often affected by errors in human judgment.

In brief, the aforementioned testing procedures have many drawbacks and insufficiencies that may be grouped together as follows:

1. The conventional integrated circuit test makes no allowance for the simulation of a user's final states. That means users may still encounter problems such as conflicts with software even if the test result indicates a pass.

2. A single type of device is placed on the testing board of an integrated circuit tester. Problems resulting from an incompatibility between different types of devices are not investigated.

3. The conventional testing method relies heavily on manual operation leading to a lowering of productivity and an increased possibility of possible human errors.

4. The conventional integrated circuit module testing method after integrated circuit assembly, also known as the module stage, has no provision for varying the operating temperature of a particular device. Hence, the simulation cannot test some actual states of operation.

5. The quality of the integrated circuit is judged according to the final integrated circuit states. Hence, some dynamic errors cannot be determined. For example, such phenomenon as video shaking, discoloring display, ghost shadows or white block in a graphics accelerator cannot be detected. Alternatively, if some software programs executing inside the integrated circuit may bring about a system crash, there is no way for a conventional testing method to discover this problem.

SUMMARY OF INVENTION

Accordingly, one object of the present invention is to provide an automatic integrated circuit testing system, device and method capable of simulating the final states of a terminal user so that the quality and reliability of the integrated circuit is ensured.

A second object of the invention is to provide an automatic integrated circuit testing system, device and method having a plurality of integrated circuit connectors working together under a single computer testing system so that the compatibility between different integrated circuits can be tested and error states between those integrated circuits can be identified.

A third object of this invention is to provide an automatic integrated circuit testing system, device and method capable of testing integrated circuits automatically without human intervention so that productivity and testing precision is increased and production cost is lowered.

A fourth object of this invention is to provide an automatic integrated circuit testing system, device and method that includes the capacity to vary the operating temperature of a particular integrated circuit so that thorough and reliable test results are obtained.

A fifth object of this invention is to provide an automatic integrated circuit testing system, device and method that includes the capacity to monitor all dynamic states of the integrated circuits automatically so that an accurate performance evaluation of the integrated circuit is obtained.

To achieve these and other advantages and in accordance with the purpose of the invention, as embodied and broadly described herein, the invention provides an automatic integrated circuit testing method. A testing computer system having one or more connectors is provided. The integrated circuits to be tested are plugged into the connectors. The integrated circuits and the testing computer are electrically connected together to form an integrative computer system. The integrative testing computer is triggered to execute a set of preset procedures such as executing a program or a series of programs. In the meantime, an image sensor or an audio signal sensor monitors the execution states of the testing computer to determine if the integrated circuits operate normally. In addition, a controller device can be provided to the testing computer for controlling the movement of the automatic plugging/unplugging machine and the testing conducted by the testing computer. The controller device can be a controller computer.

To perform a mass testing of integrated circuits, a group of testing computers are set up. Through an automatic transport device, all the testing computers may conduct integrated circuit testing concurrently. The procedure includes fetching integrated circuits to be tested from an integrated circuit supply device and bringing them to various testing computer stations using an automatic transport device. Using an automatic plugging/unplugging tool, each integrated circuit is plugged into the connector of a corresponding testing computer. The testing computer incorporating the to-be-tested integrated circuit forms an integrative testing computer. All integrative testing computers are triggered to carry out respective preset testing programs. The execution states of the testing computers are closely monitored through an image sensor or an audio signal sensor so that any abnormality in the integrated circuits can be discovered. Thereafter, the automatic transport device automatically transfers the tested integrated circuits to various integrated circuit bins according to the testing results.

According to the automatic integrated circuit testing method, this invention also provides an automatic integrated circuit testing system and device. The system includes a frame, one or more groups of testing computers, an automatic plugging/unplugging tool and an image sensor. Each testing computer holds and tests one integrated circuit. The automatic plugging/unplugging tool plugs the integrated circuit to be tested into the connector of a testing computer so that the integrated circuit and the testing computer are connected together to form an integrative computer system. The image sensor monitors the execution states of the testing computers. If this invention is used for performing mass testing of integrated circuits, additional components including an automatic transport device, an integrated circuit supply device and integrated circuit sorting bins are provided. The automatic transport device, the integrated circuit supply device and the integrated circuit sorting bins serve to transport the integrated circuits to various testing computers and sort the integrated circuits thereafter. In addition, controller device is provided to the testing computer for controlling the testing flow conducted by the testing computer. The controller device can be a controller computer.

In general, the connector of each testing computer is mounted either on a main board or an interface module depending on the type of integrated circuit. The automatic integrated circuit testing system, device and method may also incorporate a temperature control device for setting the operating temperature of a particular integrated circuit so that a thermal stress test can be conducted. The image sensor may incorporate a charge-coupled device. The charge-coupled device monitors the output devices such as the monitors or printers of various testing computers.

As the integrated circuit testing method according to this invention is carried out in the presence of an integrative computer system, both typical application programs and specific programs can be executed. Hence, terminal user states can be simulated in a testing operation. Even actual user software such as a windows operating system may be executed to determine the compatibility of the integrated circuits.

In addition, several integrated circuit connectors are linked to the same testing computer. Hence, testing devices such as the central processing unit, system bus controller, input/output bus controller, and graphics accelerator can all be plugged into their corresponding connectors and compatibility issues between different integrated circuits can be assessed and any error states in the integrated circuits can be easily determined.

Through the automatic transport device, the integrated circuit supply device, the integrated circuit bin sorter and the image sensor, mass testing integrated circuits are automatically performed without any human interference. Ultimately, productivity and testing accuracy is improved and production cost is lowered.

The operating temperature of any integrated circuit hooked up to the testing computer may be carefully set to different temperatures in order to carry out thermal stress testing. Hence, the complete and accurate testing of any integrated circuits is possible. Furthermore, the image sensor is able to monitor dynamic states of any operating integrated circuit closely so that their performance can be precisely judged.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
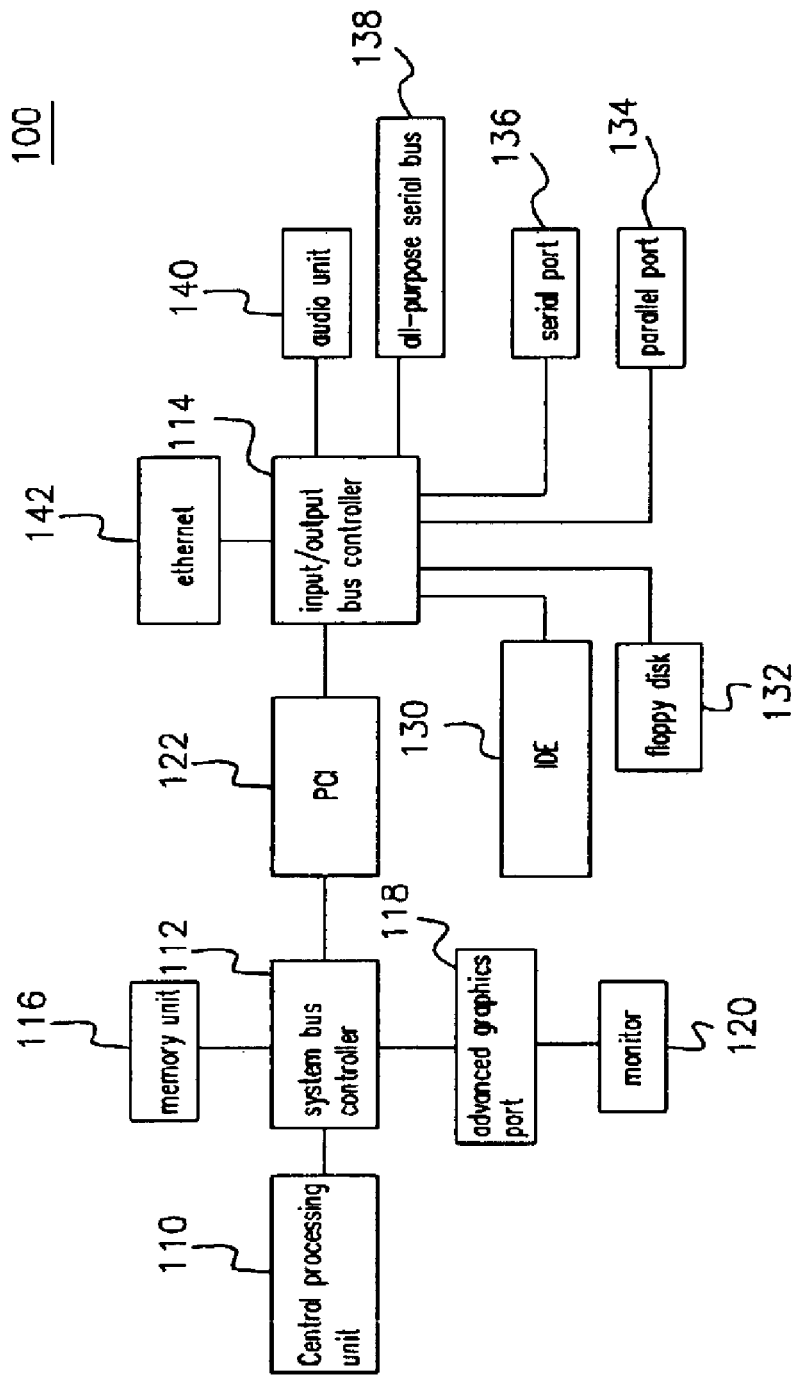
FIG. 1 is a block diagram showing the system architecture of a conventional personal computer.
Figure 2:
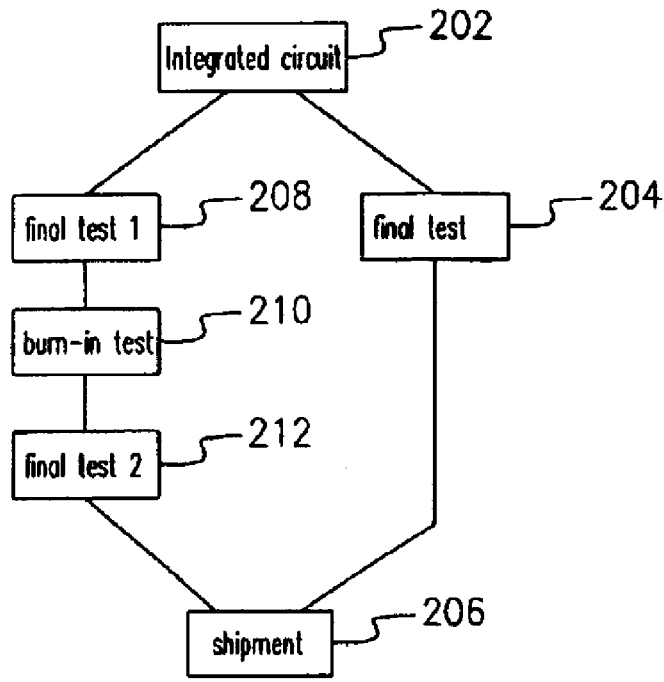
FIG. 2 is a block diagram showing steps in a conventional method of testing an integrated circuit.
Figure 3:
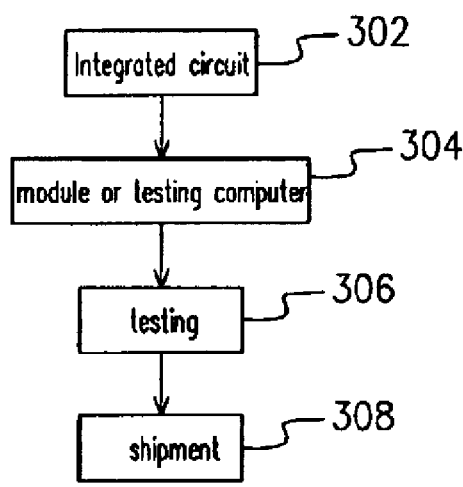
FIG. 3 is a block diagram showing the steps carried out in a conventional integrated circuit module test.

Reference will now be made in detail to the present preferred embodiments of the invention, examples of which are illustrated in the accompanying drawings. Wherever possible, the same reference numbers are used in the drawings and the description to refer to the same or like parts.

The automatic integrated circuit testing system, device and method is used together with a known good computer so that any integrated circuits used in a testing computer can be assessed. The integrated circuits that can be assessed include the central processing unit, the system bus controller, and the input/output bus controller within a personal computer or the integrated circuits within an interface module such as a graphics accelerator. In general, all these integrated circuit components are mounted on a printed circuit board including, for example, the central processing unit, the system bus controller and the input/output bus controller. The central processing unit is electrically connected to a main board through a connector such as a socket 478, socket 423, socket 370 and socket 7. Memory integrated circuits are usually attached to a modular circuit board and are electrically connected to a main board through a connector such as DIMM or RIMM. The system bus controller and the input/output bus controller are electrically connected to a main board using surface mount technology (SMT). The graphics accelerator may be directly attached to a main board by SMT. Alternatively, the graphics accelerator is formed on a modular circuit board. The modular circuit board and the main board are connected through an advanced graphic port. Integrated circuits on the peripheral component interface are formed on modular circuit boards. These integrated circuits are electrically connected to the main board through peripheral component interface slots. In addition, audio chips and Ethernet chips may also be directly attached to the main board or attached through a modular circuit board and a peripheral component interface slot. Obviously, the automatic integrated circuit testing system, device and method according to this invention have applications that need not be limited to a personal computer. Other electronic equipment including servers, workstations, desktop computers, notebook computers, portable computers, personal digital assistants, palm-top computers, pocket computers or even industrial computers may use this setup to carry out testing.

To simulate operating states of a terminal user, the integrative computer according to this invention uses a specification identical to the circuit board actually in use (main board or modular circuit board). The only difference is that, in a conventional computer used by an end user, some integrated circuits are attached to the circuit board by soldering while other integrated circuits are connected to the circuit board through a connector. In the present invention, however, the purpose of integration of the integrated circuits into the testing computer is to test them; and hence, a connector is reserved to accept a corresponding integrated circuit to be tested. These connectors can be connectors with a specialized design for testing purposes. For example, in the case the original integrated circuit is attached to a circuit board by soldering; however, instead of soldering, the integrated circuit and the circuit board are electrically connected through a connector in the present invention. In some other cases, the integrated circuits having a connector for attaching to a circuit board may also use a connector with a specialized design to facilitate testing. Obviously, the original connector may be employed if it is suitable for testing purposes. These connectors for integrated circuits may be attached to either the main board or the interface module. Alternatively, a multiple of integrated circuit connectors are attached to a single testing circuit board so that more than one integrated circuit test may proceed with the same testing circuit board. For example, when the integrative computer system includes two types of connectors A and B for accommodating two different integrated circuits A and B, two scenarios can be considered. In the first scenario, if the integrated circuit A is the circuit to be tested, a known good integrated circuit such as B1, B2 or B3 . . . may be plugged into the connector B. Hence, compatibility between the integrated circuit A with the integrated circuits B1, B2 or B3 may be determined. In the second scenario, if integrated circuit B is the circuit to be tested, a known good integrated circuit A may be plugged into the connector A. Hence, the connector B now serves as a testing connector for testing integrated circuits B.

Figure 4:
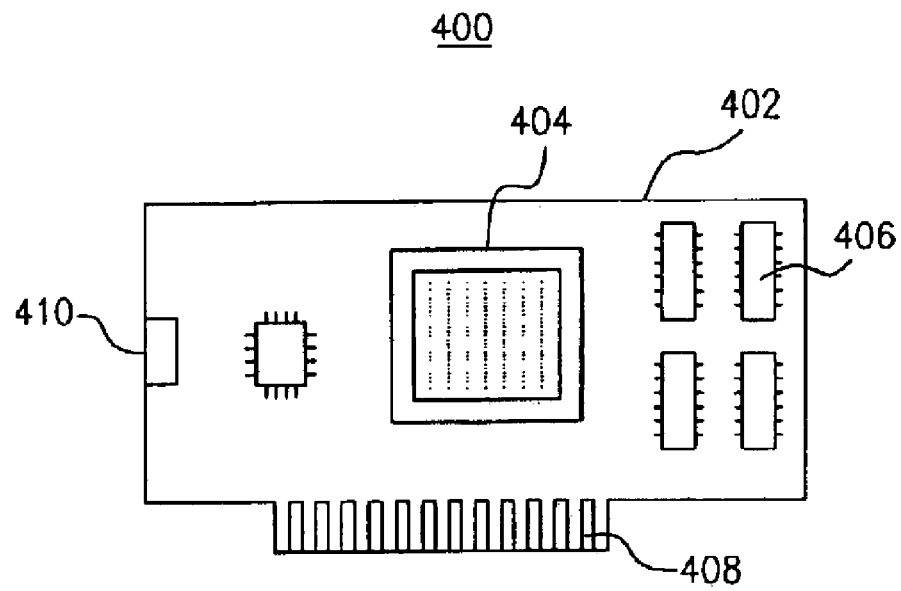
FIG. 4 is a schematic diagram showing a type of testing interface module according to one preferred embodiment of this invention.

FIG. 4 is a schematic diagram showing a type of testing interface module according to one preferred embodiment of this invention. As shown in FIG. 4, an advanced graphic port (AGP) module (400) is selected as an example. To conduct a test of the graphics accelerator attached to the module (400), an integrated circuit socket or connector (404) is positioned on the modular circuit board (402) where a would-be tested graphic accelerator chip is attached. The rest of the module (400) may contain other standard elements such as a video RAM (406), gold fingers (408) for AGP slot insertion and a monitor slot (410).

Figure 5:
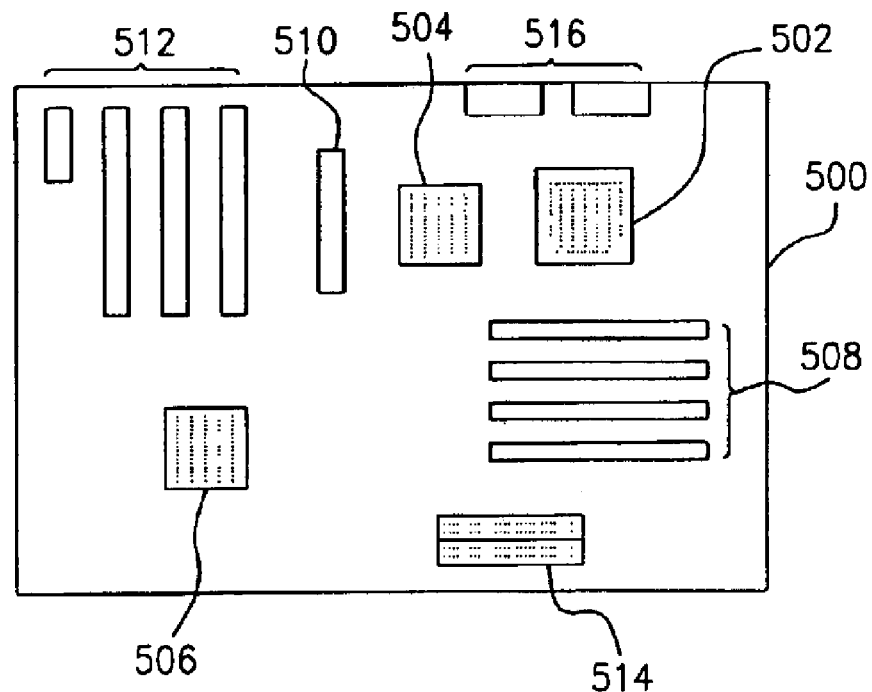
FIG. 5 is a schematic diagram showing a testing main board according to one preferred embodiment of this invention.

FIG. 5 is a schematic diagram showing a testing main board according to one preferred embodiment of this invention. As shown in FIG. 5, a main board (500) having a number of integrated circuits thereon is chosen as an example. The most important integrated circuits on the main board (500) include a central processing unit (CPU), a system bus controller and an input/output bus controller. Testing designs may be centered upon these important integrated circuits. Connectors that correspond in position to these important integrated circuits, including a CPU socket (502), a system bus controller socket (504) and an input/output bus controller socket (506), are attached at various locations on the main board (500). Other elements on the main board (500) include a DRAM slot (508), an AGP slot (510), an expansion slot (512) (including peripheral component interface (PCI) slot and CNR slot), an IDE port (514) or an input/output port (I/O port including a parallel port and a serial port) (516). These are all standard elements found on typical main boards.

The aforementioned connectors may target the packaging design of the integrated circuits to be tested such as a ball grid array package (BGA, PBGA, EBGA and so on) a pin grid array package (PGA, CPGA, PPGA), a small j-lead package (SOJ), etc.

Figure 6:
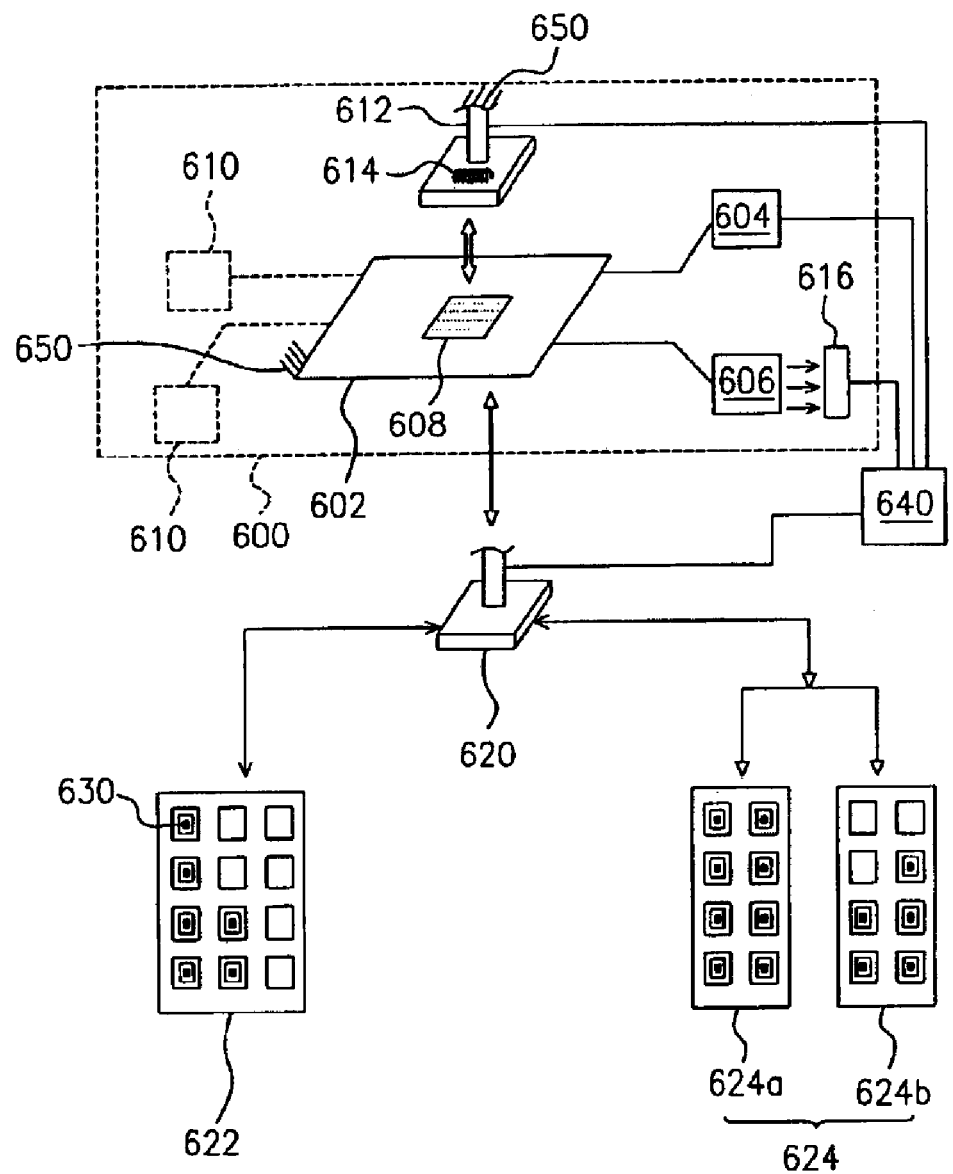
FIG. 6 is a sketch showing an automatic integrated circuit testing device according to one preferred embodiment of this invention.

FIG. 6 is a sketch showing an automatic integrated circuit testing device according to one preferred embodiment of this invention. As shown in FIG. 6, the automatic integrated circuit testing device according to this invention is built upon a station frame (650) with a known good testing computer (600) therein. The testing computer (600) at least includes a main section (602), an input/output device (604) and an output device (606). The main section (602), at a minimum, includes an integrated circuit connector (608) for accommodating a to-be-tested integrated circuit. The main section (602) may contain one single main board only. However, the main section (602) may also include an interface module by selection. The integrated circuit connector (608) may be attached to an interface module similar to the one shown in FIG. 4, or the main board may contain a multiple of integrated circuit connectors, similar to the one shown in FIG. 5. The input/output device (604), for example, can be a magnetic disk used for holding various software programs. These software programs drive the testing computer (600) and carry out various functional testing procedures. The software programs can be programs specially designed for testing or just common application programs. The output device (606) is preferably a monitor such as a cathode ray tube (CRT) or a liquid crystal display (LCD). Of course, the output device (606) can also be a printer. The output device (606) can also be a loudspeaker. In some circumstances, audio output frequencies may be monitored to check integrated circuit compatibility. Furthermore, the testing computer (600) may also includes other peripheral devices (610) such as a keyboard, a mouse, a drafting machine, a scanner, a magnetic disk, an optical disk, a digital camera, etc. These accessory peripheral devices are selected according to engineering requirements regarding the compatibility between a particular peripheral device and the integrated circuit.

The testing computer (600) is a carrier and a tester for one or more to-be-tested integrated circuits. The testing computer can be any one of the aforementioned computers. Under the best circumstances, the assembling of the integrated circuits within the testing computer system has a hardware environment identical to that of the terminal user. Therefore, the test actually checks the actual working environment. Under a preferred condition, aside from using a testing connector to connect with the tested integrated circuit, other principal integrated circuits mounted on the main section (602) are also identical to that of the terminal user. Hence, the testing computer (600) is able to simulate the actual environment faced by the terminal user and increases testing accuracy. Under an alternative preferred condition, some of the non-tested integrated circuits are attached to the circuit board through connectors. These non-tested integrated circuits may be plugged and unplugged so that identical integrated circuits are tested in tandem with a selection of different known good nontested integrated circuits. In this way, compatibility between a given integrated circuit and other known good integrated circuits can be ascertained by using the same circuit board. In yet another preferred embodiment, the main section (602) also has a plurality of connectors to conduct tests. As mentioned before, if one connector is used for testing integrated circuits, the other connectors may plug in known good integrated circuits. Because an integrative computer system is formed when an integrated circuit to be tested is plugged into the testing computer, this type of computer is called an integrative computer in the present invention. Obviously, the integrative computer may contain all the elements equipped for an actual user including other electronic devices or peripheral devices connected to the testing computer. Since the integrative computer is a functionally complete computer station, the integrative computer may execute a number of predetermined testing programs and completely simulate the operating states of a terminal user. For example, the integrative computer is able to execute general application software programs such as a windows system, an animation system or a game or may execute a special program such as the computer numerical control code of an industrial computer or CAD/CAM software programs found within a workstation. Even special testing programs may also be executed. For example, if the integrative computer is a workstation, the workstation may link together with a computer numerical control machine to carry out mechanical processing. In this way, it can be tested whether or not the integrated circuit under test can work well with other components in a real end user system environment and is capable of constituting a real end user system that can function normally, since the integrated circuit under test is a part of the testing computer. The testing system including such an integrative computer for testing the integrated circuit inserted into the integrative computer as part thereof is called an integrative computer testing system.

The integrated circuit may be plugged into an integrated circuit connector (608) through an automatic plugging/unplugging machine (612), such as a robot arm, so that the integrated circuit and the testing computer (600) are electrically connected to form an integrative computer system. The automatic plugging/unplugging machine (612) may incorporate a temperature control device (614) including a heater or a cooler. The temperature control device (614) controls the operating temperature of the integrated circuit so that the integrated circuit may be thermally stressed. Alternatively, a fan or a heat dissipation device may also be installed to simulate actual operating conditions. To initiate a testing operation, a pre-configured testing program is fed into the testing computer (600) via the input/output device (604) (drive device). The pre-configured testing program may be a command to execute a program stored inside the input/output device (604) such as a windows system or a three-dimensional image displaying program. The output device (606) is capable of outputting execution states of the testing computer (600). The integrated circuit testing device detects any images produced by the output device (606) through an image sensor (616). A comparison is subsequently made to determine if the integrated circuit operates normally with the testing computer (600). The image sensor (616) can be a charge-coupled device (CCD), for example. The image sensor (616) carries out instant dynamic monitoring of an output image of the testing computer (600) to determine if the operation of the integrated circuit undergoing the test is normal. An automatic transport device (620), such as a robotic arm, transfers a to-be-tested integrated circuit (630) from an integrated circuit supply rack (622) (such as a tray) to the testing computer (600). Thereafter, the tested integrated circuit (630) is transferred to one of the temporary storage areas (such as bin 624a or bin 624b) of the integrated circuit sorting device (624). For example, integrated circuits (630) that pass the test are transferred to a storage space inside the bin 624a while integrated circuits (630) that fail the test are transferred to a storage space inside the bin 624b.

A control unit (640) is connected to the testing computer (600), the image sensor (616) and the automatic plugging/unplugging machine (612). The control unit (640) constantly monitors the operating states of the testing computer (600) and the image sensor (616) so that the operating conditions of the integrated circuit (630) working under the testing computer (600) can be assessed. The control unit (640) also controls the automatic transport device (620) and the automatic plugging/unplugging machine (612). In other words, the control unit (640) supervises the entire testing operation. Note that the automatic transport device (620) may combine with the automatic plugging/unplugging machine (612) so that a single robotic arm can execute all the functions of both the automatic transport device (620) and the automatic plugging/unplugging machine (612). In addition, the robotic arm may also incorporate a temperature control device (614).

The automatic integrated circuit testing according to this invention includes using the automatic transport device (620) to transfer an integrated circuit (630) to be tested from the integrated circuit supply rack (622) to the testing computer (600). Next, the automatic plugging/unplugging machine (612) is used to insert the integrated circuit to be tested (630) into the connector (608), thereby forming an integrative computer system with the testing computer (600). Thereafter, a ; predetermined testing program is fed to the testing computer (600) through the input/output device (604) to initiate a testing operation. When the testing computer (600) executes the steps dictated by the testing program, the image sensor (616) constantly monitors the testing computer (600) and the quality of results, such as images produced by the output device (606), so that any abnormalities present in the testing computer are detected. Finally, according to the test results, the automatic transport device (620) picks up the tested integrated circuit and transfers it to a temporary storage bin (624a or 624b) within the integrated circuit sorting device (620). The aforementioned testing method may further include the controlling of the operating temperature of the integrated circuit (630) through the temperature control device (614) on the automatic plugging/unplugging machine (612) so that a thermal stress test is also carried out.

Figure 7:
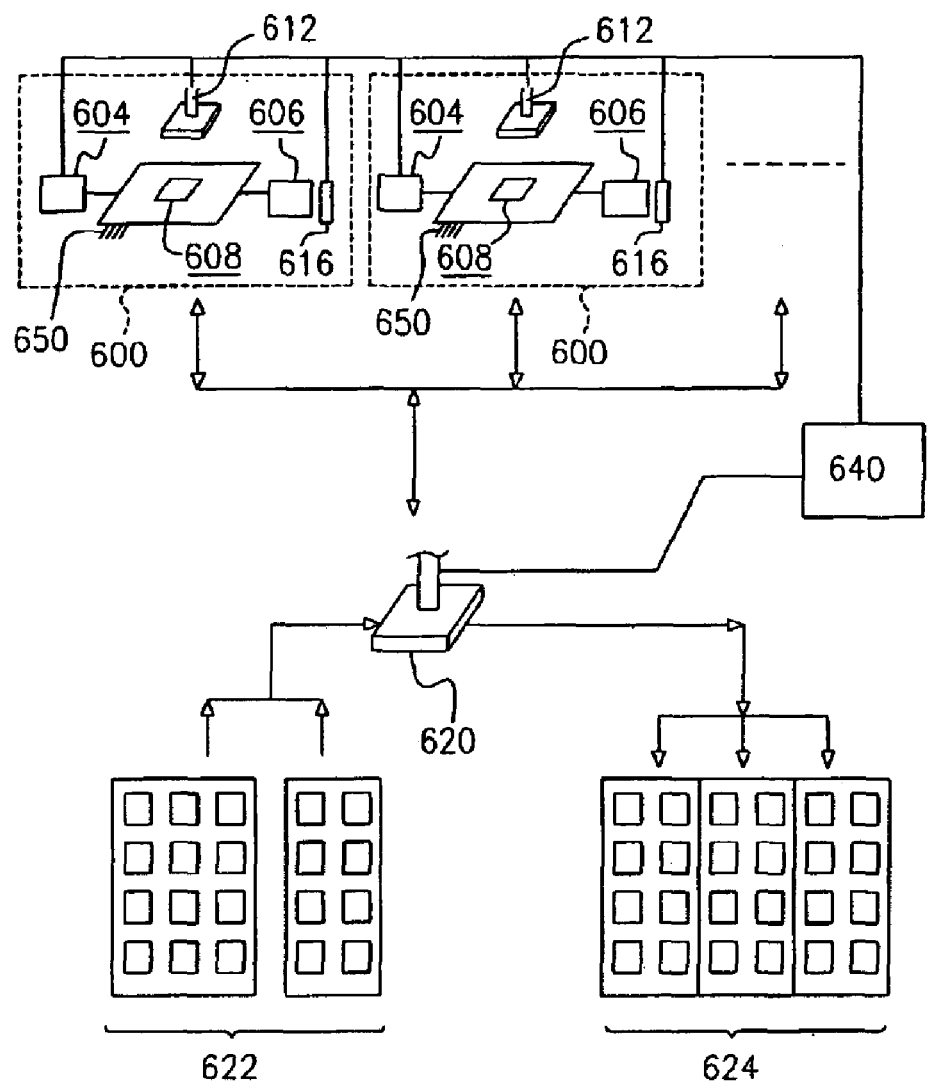
FIG. 7 is a sketch showing an automatic integrated circuit testing system for mass testing of integrated circuits according to an alternative embodiment of this invention.

FIG. 7 is a sketch showing an automatic integrated circuit testing system for mass testing of integrated circuits according to an alternative embodiment of this invention. The automatic integrated circuit testing device and method may also be applied to the mass testing of integrated circuits. To increase productivity, a group of testing computers (600) may be assembled together so that a number of integrated circuits is tested concurrently. Since each testing computer (600) is very similar to the one shown in FIG. 6, detailed description of them has been omitted. To operate the testing system, the automatic transport device (620) transfers the integrated circuits to be tested from the integrated circuit supply rack 622 to various testing computers (600). The automatic plugging/unplugging machine (612) inserts the integrated circuits into corresponding connectors (608). The testing computer receives a predetermined testing program from the input/output device (640) to carry out a testing operation. During testing, the image sensor (616) monitors the testing computer (600) by capturing images from the output device (606) so that any abnormality in the integrated circuits working with the testing computers can be detected. Note that a single image sensor (616) is capable of the real-time monitoring of a group of testing computers (600). Of course, each testing computer 600 can have its own image sensor 616, if necessary. According to the final test results, the automatic transport device (620) picks up the various tested integrated circuits 630 and places them into various temporary storage bins within the integrated circuit sorting device (620). The control unit (640) is, connected to various testing computers (600), the image sensor (616) and the automatic plugging/unplugging machine (612). The control unit (640) monitors the operating states of various testing computers (600) and the image sensor (616) so that abnormalities in any integrated circuit working with a corresponding testing computer can be detected. The test results not only control the action of the automatic transport device (620), but also control the operation of the automatic plugging/unplugging machine (612) as well. The aforementioned testing method may further include controlling the operating temperature of the integrated circuits through the temperature control device (614) on the automatic plugging/unplugging machine (612) so that a thermal stress test or a simulation of a cooling fan/heat dissipation element is also carried out.

Note that the main section may include a plurality of connectors. Hence, the testing method and device may carry out the testing of a number of integrated circuits and assess their mutual compatibility simultaneously. For example, for the structure as shown in FIG. 7, the compatibility between d system bus controller and a number of different brand name memory chips can be found by inserting "A" brand name memory into a first group of testing computers and "B" brand name memory into a second group of testing computers. In this way, a compatibility study between integrated circuits can be performed. On the other hand, the image sensor may also be set to monitor all the images produced by the testing computer or simply monitor the images of a particular output device or peripheral device. If the image sensor monitors a monitor, images from the monitor are sensed and compared. Similarly, if the image sensor monitors a printer, images of printout documents are sensed and compared. Finally, the image sensor may also monitor the actions carried out by machine stations connected to an industrial computer.

In conclusion, the automatic integrated circuit testing system, device and method according to this invention has the following advantages:

1. Since the automatic integrated circuit testing system tests an integrated circuit that connects with a complete testing computer (having a main section and major peripheral devices), operating states of a terminal user can be simulated in the test. Furthermore, actual software such as windows or three-dimensional image playback may be executed to provide an accurate assessment of in-operation integrated circuit quality.

2. The automatic integrated circuit testing device may set up a number of integrated circuit connectors linked to the same testing computer, such as a central processing unit (CPU) connector, a system bus controller connector, an input/output bus controller connector, or a graphics accelerator connector. Hence, a single testing device may check a variety of integrated circuits as well as their mutual compatibility.

3. Through the automatic transport device, the integrated circuit supply rack, the integrated circuit sorting device and the image sensor, the entire testing process is free from human intervention. Hence, productivity and testing precision is improved while production cost is reduced.

4. The automatic plugging/unplugging machine may incorporate a temperature control device for controlling the temperature for testing integrated circuits within a module. Consequently, testing and thermal stressing operations can be carried out concurrently.

5. The image sensor employed within the system monitors the dynamic states of the integrated circuit automatically. Any dynamic error occurring in the testing computer such as video shaking, discoloring display, ghost shadows or white block in a graphics accelerator can be detected. Even false actions of an industrial computer are monitored so that performance of the integrated circuit is fully inspected.

It will be apparent to those skilled in the art that various modifications and variations can be made to the structure of the present invention without departing from the scope or spirit of the invention. In view of the foregoing, it is intended that the present invention cover modifications and variations of this invention provided that they fall within the scope of the following claims and their equivalents.

What is claimed is:

1. An automatic integrated circuit testing system using an integrative computer, comprising:
    at least one testing computer for carrying and testing an integrated circuit;
    at least one automatic plugging/unplugging machine for connecting the integrated circuit into the testing computer and removing the integrated circuit out of the testing computer after the testing; and
    at least one controller device electrically connected to the testing computer and the automatic plugging/unplugging machine for controlling the movement of the automatic plugging/unplugging machine and the testing conducted by the testing computer;
    wherein the testing computer with the integrated circuit connected thereto forms an integrative computer without including the automatic plugging/unplugging machine and the controller device.

2. The testing system of claim 1, wherein the testing computer further comprises a connector for connection with the integrated circuit.

3. The testing system of claim 1, wherein the system further comprises an image sensor connected to the controller device for monitoring operating states of the testing computer by monitoring an output image thereof.

4. The testing system of claim 1, wherein the system further comprises an audio sensor connected to the controller device for monitoring an audio output from the testing computer.

5. The testing system of claim 1, wherein the system further comprises a temperature control device for controlling testing temperature of the integrated circuit.

6. The testing system of claim 1, wherein the automatic plugging/unplugging machine includes a robotic arm.

7. The testing system of claim 3, wherein the image sensor includes a charge-coupled device.

8. The testing system of claim 1, wherein the integrated circuit is selected from a group comprising of a central processing unit, a system bus controller, an input/output bus controller and a graphics accelerator.

9. The testing system of claim 1, wherein the controller device includes a computer.

10. The testing system of claim 1, wherein the system further comprises
    an integrated circuit supply device for holding the integrated circuit before testing;
    an integrated circuit sorting device having a plurality of storage areas for putting the integrated circuit after testing; and
    an automatic transport device for transferring the integrated circuit during testing.

11. An automatic integrated circuit testing method using an integrative computer, which does not include a controller device with a plugging/unplugging machine, comprising the steps of:
    providing a testing computer for holding and testing an integrated circuit;
    engaging the integrated circuit with the testing computer such that the integrated circuit and the testing computer are electrically connected to form an integrative computer;
    instructing the integrative computer to execute a predetermined testing program;
    providing an image sensor for sensing output images produced by the integrative computer during testing program execution; and
    determining if the integrated circuit is normal according to the output images captured by the image sensor.

12. The method of claim 11, wherein the step of engaging the integrated circuit with the testing computer is carried out through an automatic plugging/unplugging machine.

13. The method of claim 11, wherein the step of executing the predetermined testing program further comprises controlling the temperature of the integrated circuit.

14. The method of claim 11, wherein the integrative computer further comprises a controller device that controls the following steps:
    engaging the integrated circuit with the testing computer such that the integrated circuit and the testing computer are electrically connected;
    instructing the integrative computer to execute a predetermined program;
    monitoring output images from the integrative computer through the image sensor; and
    determining if the integrated circuit is normal according to the images captured by the image sensor.

15. The method of claim 14, wherein the integrative computer further comprises control steps of:
    holding the integrated circuit before testing by an integrated circuit supply device;
    moving the integrated circuit during testing by an automatic transport device; and
    arranging the integrated circuit into a plurality of storage areas of an integrated circuit sorting device according to testing results.

16. An automatic integrated circuit testing device using an integrative computer, comprising:
    a testing computer for holding and testing an integrated circuit, wherein the testing computer with the integrated circuit connected thereto forms an integrative computer to carry out integrative testing, wherein the integrative computer does not include a controller device with a plugging/unplugging machine; and
    an image sensor for monitoring dynamic operating states of an image output of the testing computer while the testing computer executes a predetermined testing program so that conditions of the integrated circuit is assessed from test results.

17. The integrative testing device of claim 16, wherein the testing computer further comprises a connector for engaging the integrated circuit with the testing computer electrically.

18. The integrative testing device of claim 16, wherein the device further comprises a temperature control device for controlling the temperature of the integrated circuit.

19. An automatic integrated circuit testing system using an integrative computer system, comprising:
   a plurality of testing computers with each testing computer capable of holding and testing an integrated circuit, wherein the testing computers each with a corresponding integrated circuit connected thereto form a plurality of integrative computers and each of the integrative computers executes a plurality of general application programs or special application programs for integrative testing;
   an automatic transport device for fetching integrated circuits and delivering the integrated circuits to the testing computers, and sorting out the tested integrated circuits according to test results of each of the integrated circuits;
   at least one automatic plugging/unplugging machine for moving the automatic transport device to the testing computers and engaging the integrated circuits with a corresponding one of the testing computers so that the integrated circuits and the testing computers are electrically connected, wherein the integrative computers do not include the automatic transport device and the automatic plugging/unplugging machine; and
   at least one image sensor for real-time monitoring of a testing operation.

20. The testing system of claim 19, wherein the system further comprises a controller device that connects with the testing computers, the image sensor, the automatic transport device and the automatic plugging/unplugging machine, the controller device monitors operating states of the integrative computers and the image sensor, and controls a movement of the automatic transport device and the automatic plugging/unplugging machine so that an entire testing procedure is supervised.

21. The testing system of claim 19, wherein the system further comprises a temperature control device for controlling the operating temperatures of various integrated circuits.

22. An automatic integrated circuit testing method using an integrative computer system, comprising the steps of:
   transferring at least one integrated circuit from an integrated circuit storage device to at least one testing computer, and engaging the at least one integrated circuit with the at least one testing computer to form each of at least one integrative computer by an automation device, wherein the integrative computer does not include a transporting device and a plugging/unplugging machine;
   instructing the at least one integrative computer to execute a testing program; and
   monitoring outputs from the at least one integrative computer to determine if the integrated circuit is normal.

23. The method of claim 22, wherein the testing system further comprises a controller device for controlling a plurality of automation devices during a testing operation.

24. The method of claim 22, wherein the outputs from the integrative computer are image outputs and are monitored by an image sensor.

25. The method of claim 22, wherein after testing the integrated circuit, the integrated circuit is sorted into appropriate bins.

26. The method of claim 22, wherein temperature of the integrated circuit is controlled during a testing operation.

27. The method of claim 22, wherein the testing computer includes at least a first testing computer and a second testing computer each having a different hardware structure.

28. The method of claim 22, wherein the testing computer includes a first testing computer and a second testing computer, the first testing computer executes a first testing program and the second testing computer executes a second testing program different from said first test program.

29. The method of claim 27, wherein the integrated circuit is tested by the first testing computer and the second testing computer.

30. The method of claim 23, wherein the controller device includes a computer.

* * * * *